(12) United States Patent
Hoe et al.

(10) Patent No.: US 11,096,284 B2
(45) Date of Patent: Aug. 17, 2021

(54) COMPACT SEMICONDUCTOR CHIP SYSTEM AND METHOD

(71) Applicant: Intel Corporation, Santa Clara, CA (US)

(72) Inventors: Wee Hoe, Bayan Lepas (MY); Chan Kim Lee, Bayan Lepas (MY); Chee Chun Yee, Bayan Lepas (MY); Mooi Ling Chang, Bayan Baru (MY); Siang Yeong Tan, Bayan Lepas (MY); Say Thong Tony Tan, Island Park (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/451,542

(22) Filed: Jun. 25, 2019

(65) Prior Publication Data

US 2020/0107444 A1    Apr. 2, 2020

(30) Foreign Application Priority Data

Oct. 1, 2018 (MY) .............................. PI2018703612

(51) Int. Cl.

| G06F 1/16 | (2006.01) |
|---|---|
| H05K 1/18 | (2006.01) |
| H01L 25/16 | (2006.01) |
| H01Q 1/22 | (2006.01) |
| H01L 23/538 | (2006.01) |

(52) U.S. Cl.

CPC ............. *H05K 1/181* (2013.01); *G06F 1/16* (2013.01); *H01L 25/16* (2013.01); *H01Q 1/2258* (2013.01); *H01L 23/5384* (2013.01); *H05K 2201/10098* (2013.01); *H05K 2201/10128* (2013.01); *H05K 2201/10159* (2013.01)

(58) Field of Classification Search
None
See application file for complete search history.

(56) References Cited

U.S. PATENT DOCUMENTS

| 2014/0002989 | A1* | 1/2014 | Ahuja | .................... G06F 1/20 361/679.54 |
|---|---|---|---|---|
| 2014/0175636 | A1* | 6/2014 | Roy | .................... H01L 23/5383 257/737 |
| 2015/0216053 | A1* | 7/2015 | Sauer | .................... H01L 25/0652 361/783 |
| 2017/0090956 | A1* | 3/2017 | Linsky | ................ G06F 15/7867 |
| 2018/0331081 | A1* | 11/2018 | Goh | ..................... H01L 23/48 |
| 2019/0042234 | A1* | 2/2019 | Bernat | ................... G06F 3/0629 |

* cited by examiner

*Primary Examiner* — Anthony Q Edwards
*Assistant Examiner* — Rashen E Morrison
(74) *Attorney, Agent, or Firm* — Schwegman Lundberg & Woessner, P.A

(57) ABSTRACT

A semiconductor device and associated methods are disclosed. In one example, a processor die is coupled to a first side of a package substrate, and a memory die coupled to a second side of the package substrate. A system accelerator die is further coupled to the package substrate. In selected examples, the system accelerator die provides performance improvements, such as higher cached memory speed and/or higher memory bandwidth.

16 Claims, 3 Drawing Sheets

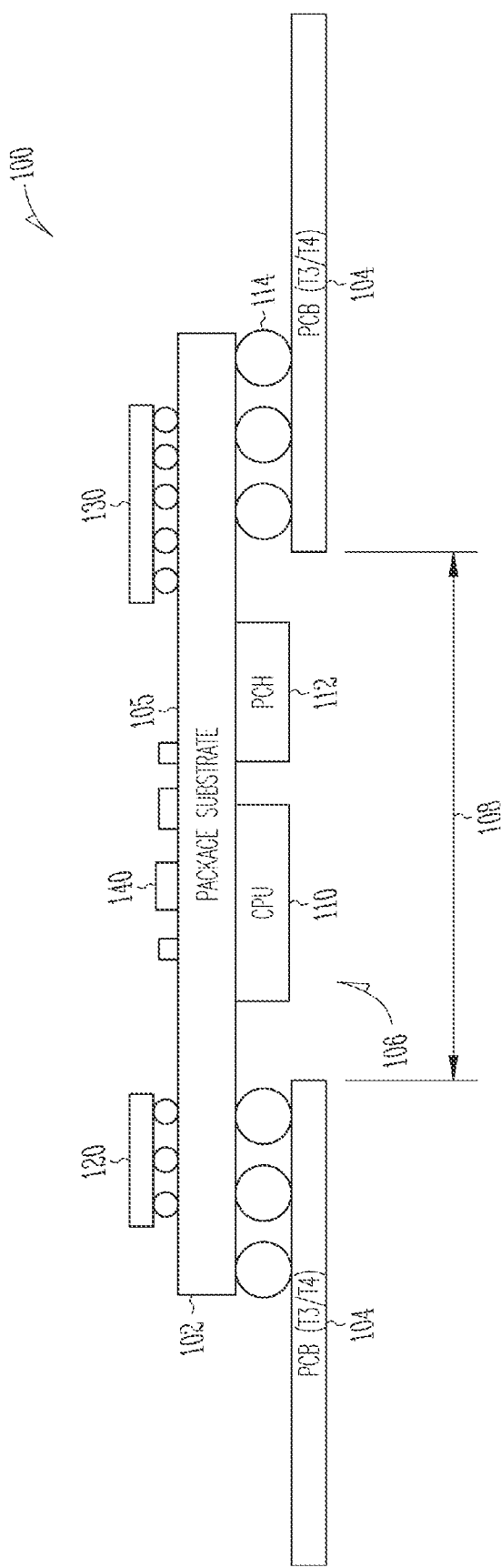

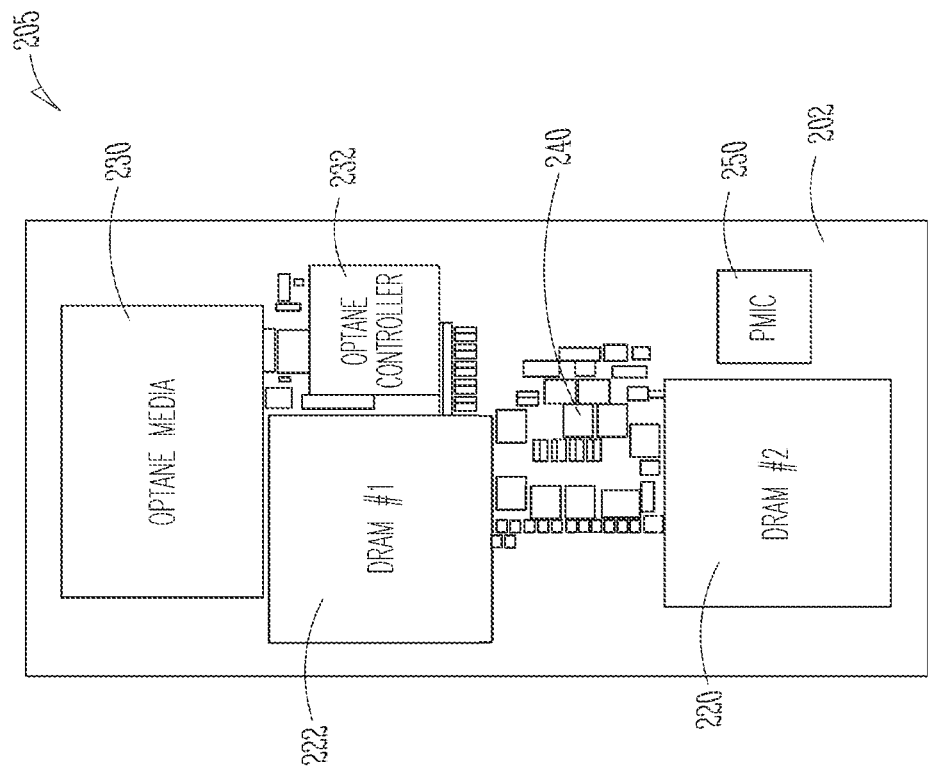
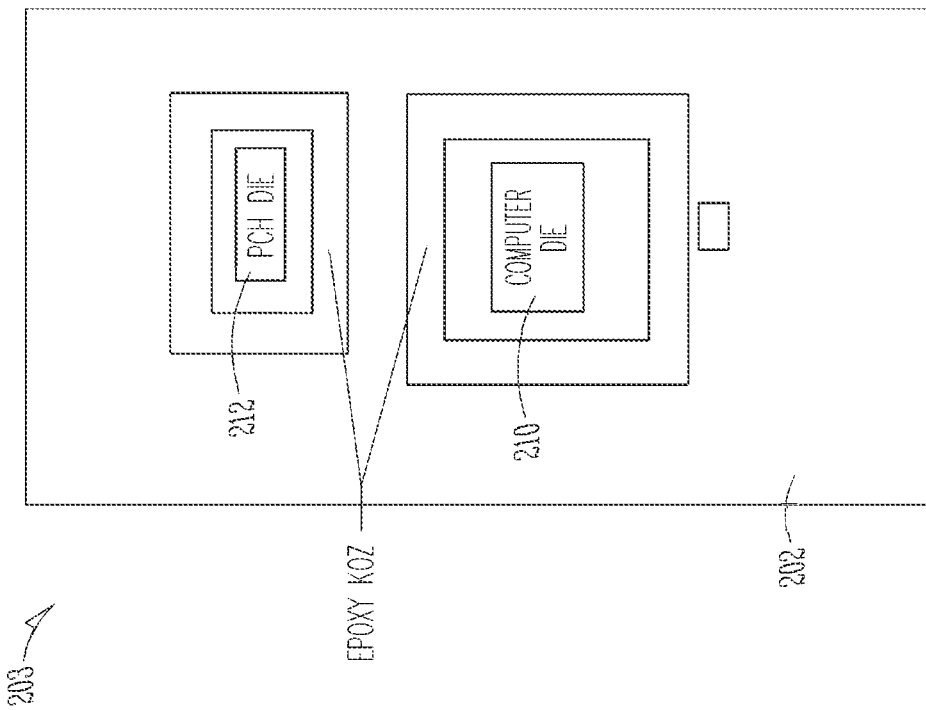

COMPACT SEMICONDUCTOR CHIP SYSTEM AND METHOD

PRIORITY APPLICATION

This application claims the benefit of priority to Malaysian Application Serial Number PI 2018703612, filed Oct. 1, 2018, which is incorporated herein by reference in its entirety.

TECHNICAL FIELD

Embodiments described herein generally semiconductor chip devices and systems. Examples includes systems on chip (SOC) and systems in package (SiP).

BACKGROUND

Semiconductor devices face ever present challenges of pressure for smaller device form factors, with additional pressure on improved system performance. New device configurations and methods are desired to address these, and other technical challenges.

BRIEF DESCRIPTION OF THE DRAWINGS

FIG. 1 shows a side block diagram view of a semiconductor device in accordance with some example embodiments.

FIG. 2A shows a first side of a package substrate in accordance with some example embodiments.

FIG. 2B shows a second side of the package substrate from FIG. 2A in accordance with some example embodiments.

DESCRIPTION OF EMBODIMENTS

Figure 3:
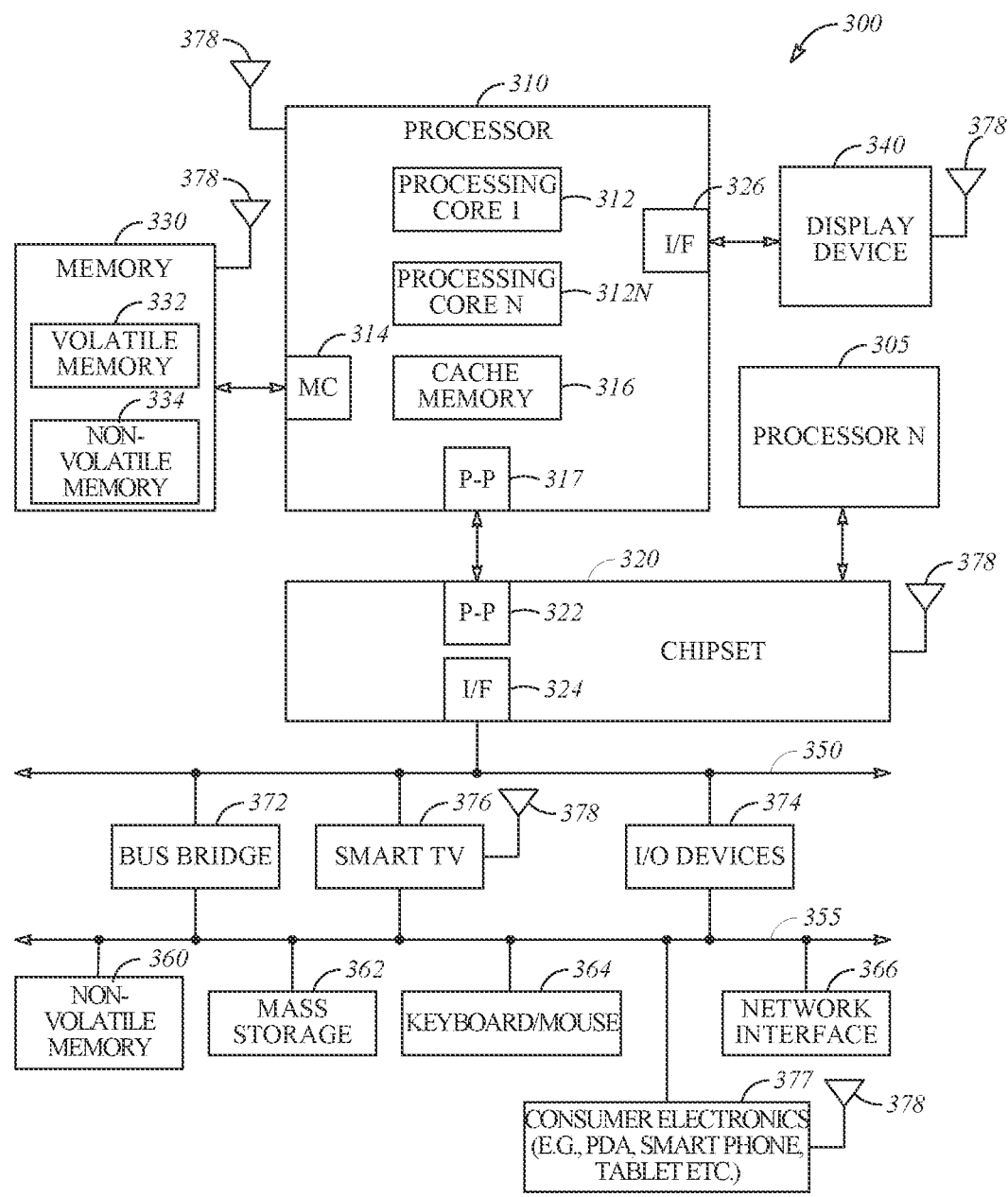
FIG. 3 shows a system that may incorporate semiconductor devices and methods, in accordance with some example embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In the figures and the text that follows, the terms "top" and "bottom" are used to show orientations of particular features on particular elements, or relative orientations of one element to another element. The designations of top and bottom are used merely for convenience and clarity, and are not intended to represent absolute orientation or direction. For example, a "top" surface of an element remains a top surface regardless of an absolute orientation of the element, even if the element is inverted during storage or use. This document uses the common convention of a chip package being positioned on top of a motherboard, which establishes directions of up and down, and top and bottom, relative to this convention.

FIG. 1 shows a semiconductor device 100. The semiconductor device 100 includes a package substrate 102. Examples of package substrate 102 may include a cored substrate or a coreless substrate. In one example, a coreless substrate is used to further facilitate reduced z-height of the semiconductor device 100. As shown, a single package substrate is used to couple multiple dies. Configurations of dies in the present disclosure reduce z-height, and reduce an X-Y footprint of the semiconductor device 100. By arranging components in compact formations, several advantages can be realized. Advantages include, but are not limited to, increased space in a device shell for additional battery size, and increased device performance as a result of the selected combination of dies. One example of such a device includes a mobile telephone. Other examples include, but are not limited to, laptop computers, desktop computers, servers, etc.

A number of dies are shown coupled to the package substrate 102 in FIG. 1. A processor die 110 is shown coupled to a first side 103 of the package substrate 102. In one example, the processor die 110 includes multiple cores. Other examples may include a single core. In one example, the processor die is part of a system on chip (SOC). A memory die 120 is shown coupled to a second side 105 of the package substrate 102. The processor die 110 is electrically coupled to the memory die 120 through routing traces and vias in the package substrate 102 (not shown). A system accelerator die 130 is further shown coupled to the second side 105 of the package substrate 102.

One example of a system accelerator die 130 includes a cross point memory die, for example a 3D Xpoint die from Intel®. Examples of cross point memory include a phase change material located at crossing points in a row and column configuration of transmission lines. Cross point memory configurations include advantages such as high memory access times, at a reduced cost in comparison to other memory types, such as dynamic random access memory (DRAM). In one configuration, the system accelerator die 130 is configured to provide an interface between external memory and the processor die 110. Selected configurations of the system accelerator die 130 provide higher cached memory speed and/or higher memory bandwidth. When combined with a slower external memory device, the system accelerator die 130 can store large amounts of data provided earlier from the external memory device, and make the stored data quickly accessible to the processor die 110. This leads to an end user experience that is much faster than relying solely on the data I/O speed of the external memory device. One example of a system accelerator die 130 includes an Optane™ die from Intel®.

In the example shown, the processor die 110 is on the first side 103 of the package substrate 102, and the memory die 120 and system accelerator die 130 are on the second side 105 of the package substrate 102. This configuration facilitates a semiconductor device 100 that is smaller in z-height, and smaller in X-Y area, by arranging the dies in a more compact configuration. In other examples, the processor die 110, memory die 120, and system accelerator die 130 may be in other physical arrangements. In selected configurations, a system accelerator die 130 may be plugged into a socket on a motherboard, such as an M2 socket. By including the system accelerator die 130 on a single package substrate 102, along with the memory die 120 and the processor die 110, additional space is saved, and performance is improved due to closer physical location of the dies.

In one example, a platform controller hub (PCH) die 112 is further included on the first side 103 of the package substrate 102, adjacent to the processor die 110. One advantage of dividing operations between the processor die 110 and the PCH die 112 includes improved manufacturing yield. In one example, integrating large numbers of devices onto a single die increases complexity, and may lead to higher yield loss in manufacturing. Two smaller dies may be easier to produce at a high yield. Another advantage may include design flexibility in creating different types of semiconductor devices. Some devices may not need the additional functions of a PCH die 112. By making the PCH die 112 separate from the processor die 110, a designer is easily able to omit an unnecessary die in a different product mix.

The example of FIG. 1 further shows one or more passive devices 140 coupled to the second side 105 of the package substrate 102. Examples of passive devices 140 include, but are not limited to, capacitors, inductors, resistors, etc. In one example, capacitors are used to aid in power delivery. By locating the passive devices 140 on a side of the package substrate 102 opposite the processor die 110 and the PCH die 112, the passive devices 140 are able to be in close proximity to the processor die 110 and the PCH die 112 for improved power performance, and any z-height of the passive devices 140 is included beneath adjacent dies such as the memory die 120 and system accelerator die 130.

In the example of FIG. 1, the package substrate 102 is further shown mounted to circuit board 104, such as a mother board. The example of FIG. 1, shows a number of solder balls 114 to make this connection. In one example, the circuit board 104 includes an opening 106. In one example, the processor die 110 and the PCH die 112 are located at least partially within the opening. The opening 106 is shown projecting a footprint 108. In the example shown, the processor die 110 and the PCH die 112 are located within the footprint 108, even if they are not physically between the sides of the circuit board 104.

FIGS. 2A and 2B show additional detail of opposite sides of a package substrate 202, similar to package substrate 102 shown in FIG. 1. FIG. 2A illustrates a first side 203, with FIG. 2B illustrates a second side 205. The example sides (203, 205) shown in FIGS. 2A and 2B correspond to sides 103 and 105 from FIG. 1.

In FIG. 2A, a processor die 210 and a PCH die 212 are shown, similar to the processor die 110 and PCH die 112 from FIG. 1. FIG. 2B shows a first memory die 220 and a second memory die 222. In one example, more than two memory dies may be used. In other examples, only one memory die is used. FIG. 2B further shows a number of passive devices 240 located between other dies on the second side 205 of the substrate 202. In the example of FIG. 2B, the passive devices are most closely located between the first memory die 220 and the second memory die 222, although the invention is not so limited.

FIG. 2B further shows an example of a system accelerator die 230, similar to system accelerator die 130 from FIG. 1. In selected examples, a system accelerator controller die 232 may further be included. Advantages of having a system accelerator controller die 232 separate from the system accelerator die 130 are similar to the separation of the processor die 110 and PCH die 112. Advantages may include improved manufacturing yield by dividing dies into smaller components. Another advantage may include design flexibility in creating different types of semiconductor devices that may require different types of controller dies, or may not require a controller die.

In one example, as further shown in FIG. 2B, a power management integrated circuit (PMIC) die 250 is further included on the second side 250 of the package substrate 102. One example function that may be controlled by the PMIC includes controlling multiple voltages for different die and circuit requirements. Other functions may include, but are not limited to, voltage regulation, battery charging, power source selection, and dynamic frequency scaling.

FIG. 3 illustrates a system level diagram, depicting an example of an electronic device (e.g., system) that may include a semiconductor device, such as a system on chip (SOC) or a system in package (SiP) as described above. FIG. 3 may also illustrate a system level diagram of an electronic device used to execute examples of the methods described above. In one embodiment, system 300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 30X) is a system on a chip (SOC) system. As described in examples above, although different components in system 300 may be shown as separate in the block diagram format of FIG. 3, in some examples, multiple dies and other components are incorporated onto a single substrate.

In one embodiment, processor 310 has one or more processor cores 312 and 312N, where 312N represents the Nth processor core inside processor 310 where N is a positive integer. In one embodiment, system 300 includes multiple processors including 310 and 305, where processor 305 has logic similar or identical to the logic of processor 310. In some embodiments, processing core 312 includes, but is not limited to, pre-fetch logic to fetch instructions, decode logic to decode the instructions, execution logic to execute instructions and the like. In some embodiments, processor 310 has a cache memory 316 to cache instructions and/or data for system 300. Cache memory 316 may be organized into a hierarchal structure including one or more levels of cache memory.

In some embodiments, processor 310 includes a memory controller 314, which is operable to perform functions that enable the processor 310 to access and communicate with memory 330 that includes a volatile memory 332 and/or a non-volatile memory 334. In some embodiments, processor 310 is coupled with memory 330 and chipset 320. Processor 310 may also be coupled to a wireless antenna 378 to communicate with any device configured to transmit and/or receive wireless signals. In one embodiment, an interface for wireless antenna 378 operates in accordance with, but is not limited to, the IEEE 802.11 standard and its related family, Home Plug AV (HPAV). Ultra Wide Band (UWB), Bluetooth, WiMax, or any form of wireless communication protocol. In the example shown, the processor 310 connects to display device 340 via interface 326. Display 340 may be, for example, a liquid crystal display (LCD), a light emitting diode (LED) array, an organic light emitting diode (OLED) array, or any other form of visual display device.

In some embodiments, volatile memory 332 includes, but is not limited to, Synchronous Dynamic Random Access Memory (SDRAM), Dynamic Random Access Memory (DRAM). RAMBUS Dynamic Random Access Memory (RDRAM), and/or any other type of random access memory device. Non-volatile memory 334 includes, but is not limited to, flash memory, phase change memory (PCM), read-only memory (ROM), electrically erasable programmable read-only memory (EEPROM), or any other type of non-volatile memory device.

Memory 330 stores information and instructions to be executed by processor 310. In one embodiment, memory 330 may also store temporary variables or other intermediate information while processor 310 is executing instructions. In the illustrated embodiment, chipset 320 connects with processor 310 via Point-to-Point (PtP or P-P) interfaces 317 and 322. Chipset 320 enables processor 310 to connect to other elements in system 300. In some embodiments of the example system, interfaces 317 and 322 operate in accordance with a PtP communication protocol such as the Intel® QuickPath Interconnect (QPI) or the like. In other embodiments, a different interconnect may be used.

In some embodiments, chipset 320 is operable to communicate with processor 310, 305N, display device 340, and other devices, including a bus bridge 372, a smart TV 376, I/O devices 374, nonvolatile memory 360, a storage medium (such as one or more mass storage devices) 362, a keyboard/mouse 364, a network interface 366, and various forms of consumer electronics 377 (such as a PDA, smart phone, tablet etc.), etc. In one embodiment, chipset 320 couples with these devices through an interface 324. Chipset 320 may also be coupled to a wireless antenna 378 to communicate with any device configured to transmit and/or receive wireless signals.

In some embodiments of the example system, processor 310 and chipset 320 are merged into a single SOC. In addition, chipset 320 connects to one or more buses 350 and 355 that interconnect various system elements, such as I/O devices 374, nonvolatile memory 360, storage medium 362, a keyboard/mouse 364, and network interface 366. Buses 350 and 355 may be interconnected together via a bus bridge 372.

In one embodiment, mass storage device 362 includes, but is not limited to, a solid state drive, a hard disk drive, a universal serial bus flash memory drive, or any other form of computer data storage medium. In one embodiment, network interface 366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 3 are depicted as separate blocks within the system 300, the functions performed by some of these blocks may be integrated within a single semiconductor circuit or may be implemented using two or more separate integrated circuits. For example, although cache memory 316 is depicted as a separate block within processor 310, cache memory 316 (or selected aspects of 316) can be incorporated into processor core 312.

To better illustrate the method and apparatuses disclosed herein, a non-limiting list of embodiments is provided here:

Example 1 includes a semiconductor device, including a processor die coupled to a first side of a package substrate, a memory die coupled to a second side of the package substrate, opposite the first side, and a system accelerator die coupled to the second side of the package substrate.

Example 2 includes the semiconductor device of example 1, wherein the system accelerator die is configured to buffer data between a hard drive and the processor die.

Example 3 includes the semiconductor device of any of examples 1-2, wherein the system accelerator die is configured to buffer data between a solid state hard drive and the processor die.

Example 4 includes the semiconductor device of any of examples 1-3, further including a processor host controller die coupled to the first side of the package substrate.

Example 5 includes the semiconductor device of any of examples 1-4, further including one or more passive devices located between the memory die and the system accelerator die on the second side of the package substrate.

Example 6 includes the semiconductor device of any of examples 1-5, wherein the one or more passive devices includes one or more power decoupling capacitors.

Example 7 includes a semiconductor device, including a processor die coupled to a first side of a package substrate and a processor host controller die coupled to the first side of the package substrate adjacent to the processor die. The semiconductor device also includes one or more capacitors coupled to a second side of the package substrate, directly opposite the processor die and the processor host controller die, at least one memory die coupled to the second side of the package substrate, and laterally offset from the one or more capacitors, and a system accelerator die coupled to the second side of the package substrate, and laterally offset from the one or more capacitors.

Example 8 includes the semiconductor device of example 7, further including a motherboard, wherein the motherboard includes an opening, and wherein the package substrate is coupled to the motherboard with the processor die and the processor host controller die located at least partially within the opening.

Example 9 includes the semiconductor device of any of examples 7-8, wherein the at least one memory die includes two dynamic random, access memory (DRAM) memory dies.

Example 10 includes the semiconductor device of any of examples 7-9, further including a controller die for the a system accelerator die coupled to the second side of the package substrate adjacent to the system accelerator die.

Example 11 includes the semiconductor device of any of examples 7-10, further including a power management integrated circuit (PMIC) die coupled to the second side of the package substrate.

Example 12 includes an electronic system. The electronic system includes a motherboard, a display device electrically connected to the motherboard, and an antenna electrically connected to the motherboard. The electronic system also includes a system on chip (SOC) coupled to the motherboard, wherein the SOC includes a processor die coupled to a first side of a package substrate, a memory die coupled to a second side of the package substrate, opposite the first side, and a system accelerator die coupled to the second side of the package substrate.

Example 13 includes the electronic system of example 12, wherein the motherboard includes an opening, and wherein the package substrate is coupled to the motherboard with the processor die and the processor host controller die located at least partially within the opening.

Example 14 includes the electronic system of any of examples 12-13, wherein the display device includes a touch screen display device.

Example 15 includes the electronic system of any of examples 12-14, wherein the antenna includes a WiFi antenna.

Example 16 includes the electronic system of any of examples 12-15, wherein the antenna includes a cellular antenna.

Example 17 includes the electronic system of any of examples 12-16, further including a hard drive, and wherein the system accelerator die is configured to buffer data between the hard drive and the processor die.

Example 18 includes the electronic system of any of examples 12-17, wherein the hard drive includes a solid state hard drive.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second." and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]." depending on the context.

The invention claimed is:

1. A semiconductor device, comprising:
   a processor die coupled to a first side of a package substrate;
   a memory die coupled to a second side of the package substrate, opposite the first side; and
   a cross point system accelerator die coupled to the second side of the package substrate, wherein the system accelerator die is configured to buffer data between a hard drive and the processor die.

2. The semiconductor device of claim 1, wherein the system accelerator die is configured to buffer data between a solid state hard drive and the processor die.

3. The semiconductor device of claim 1, further including a processor host controller die coupled to the first side of the package substrate.

4. The semiconductor device of claim 1, further including one or more passive devices located between the memory die and the system accelerator die on the second side of the package substrate.

5. The semiconductor device of claim 4, wherein the one or more passive devices includes one or more power decoupling capacitors.

6. A semiconductor device, comprising:
   a processor die coupled to a first side of a package substrate;
   a processor host controller die coupled to the first side of the package substrate adjacent to the processor die;
   one or more capacitors coupled to a second side of the package substrate, directly opposite the processor die and the processor host controller die;

at least one memory die coupled to the second side of the package substrate, and laterally offset from the one or more capacitors; and a cross point system accelerator die coupled to the second side of the package substrate, and laterally offset from the one or more capacitors, wherein the system accelerator die is configured to buffer data between a hard drive and the processor die.

7. The semiconductor device of claim 6, further including a motherboard, wherein the motherboard includes an opening, and wherein the package substrate is coupled to the motherboard with the processor die and the processor host controller die located at least partially within the opening.

8. The semiconductor device of claim 6, wherein the at least ogre memory die includes two dynamic random, access memory (DRAM) memory dies.

9. The semiconductor device of claim 6, further including a controller die for the a system accelerator die coupled to the second side of the package substrate adjacent to the system accelerator die.

10. The semiconductor device of claim 6, further including a power management integrated circuit (PMIC) die coupled to the second side of the package substrate.

11. An electronic system, comprising:
a motherboard;
a display device electrically connected to the motherboard;
an antenna electrically connected to the motherboard;
a system on chip (SOC) coupled to the motherboard, wherein the SOC includes:
a processor die coupled to a first side of a package substrate;
a memory die coupled to a second side of the package substrate, opposite the first side;
a cross point system accelerator die coupled to the second side of the package substrate; and
a hard drive, and wherein the system accelerator die is configured to buffer data between the hard drive and the processor die.

12. The electronic system of claim 11, wherein the motherboard includes an opening, and wherein the package substrate is coupled to the motherboard with the processor die and a processor host controller die located at least partially within the opening.

13. The electronic system of claim 11, wherein the display device includes a touch screen display device.

14. The electronic system of claim 11, wherein the antenna includes a WiFi antenna.

15. The electronic system of claim 11, wherein the antenna includes a cellular antenna.

16. The electronic system of claim 11, wherein the hard drive includes a solid state hard drive.

* * * * *